(12) United States Patent
Peng

(10) Patent No.: US 6,514,648 B2
(45) Date of Patent: Feb. 4, 2003

(54) METHOD TO PRODUCE EQUAL SIZED FEATURES IN MICROLITHOGRAPHY

(75) Inventor: Song Peng, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/944,382

(22) Filed: Sep. 4, 2001

(65) Prior Publication Data

US 2002/0012854 A1 Jan. 31, 2002

Related U.S. Application Data

(62) Division of application No. 09/141,687, filed on Aug. 28, 1998.

(51) Int. Cl.$^7$ .............................. G03F 9/00; G03C 5/00
(52) U.S. Cl. ............................................ 430/30; 430/5
(58) Field of Search ................................. 430/30, 22, 5

(56) References Cited

U.S. PATENT DOCUMENTS

| | | | |
|---|---|---|---|
| 5,358,827 A | 10/1994 | Garofalo et al. | 254/323 |
| 5,424,154 A | 6/1995 | Borodovsky | 430/313 |
| 5,447,810 A | 9/1995 | Chen et al. | 430/5 |
| 5,498,579 A | 3/1996 | Borodovsky et al. | 395/500.2 |
| 5,585,210 A | 12/1996 | Lee et al. | 430/5 |
| 5,636,002 A | 6/1997 | Garofalo | 355/53 |
| 5,821,014 A | 10/1998 | Chen et al. | 430/5 |

*Primary Examiner*—Mark F. Huff
*Assistant Examiner*—Saleha R. Mohamedulla
(74) *Attorney, Agent, or Firm*—Connolly Bove Lodge & Hutz; William D. Sabo

(57) ABSTRACT

A microlithography mask for producing equal size features in a substrate. A first region exposes a first portion of the substrate corresponding to a first feature that is to be formed on the substrate. At least one compensating region in the vicinity of the first region partially exposes the first portion of the substrate and a second portion of the substrate corresponding to a second feature, wherein the second feature is to be removed from the substrate.

2 Claims, 2 Drawing Sheets

$W_i = W_n$

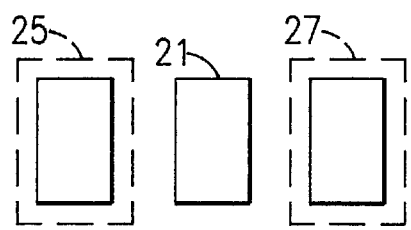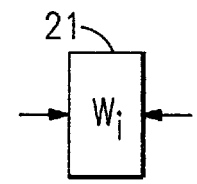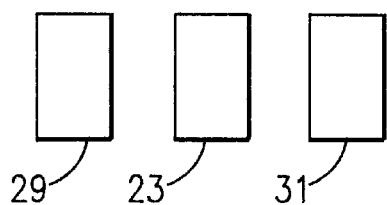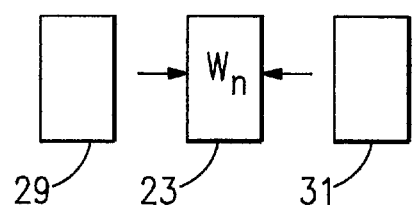
FIG.3a    FIG.3b
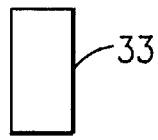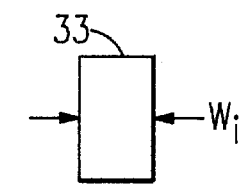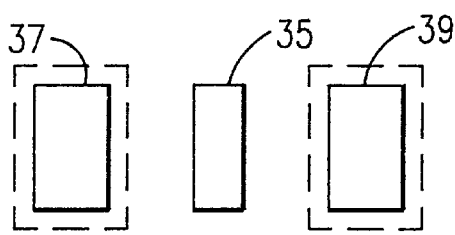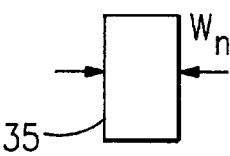
FIG.4a    FIG.4b

METHOD TO PRODUCE EQUAL SIZED FEATURES IN MICROLITHOGRAPHY

CROSS-REFERENCE TO RELATED APPLICATION

This application is a divisional of copending U.S. patent application Ser. No. 09/141,687, filed Aug. 28, 1998.

FIELD OF THE INVENTION

The present invention relates to manufacture of integrated circuit devices using microlithography techniques. In particular, the present invention is directed to a mask and method for creating isolated features that have similar physical characteristics to similar features that are not isolated.

BACKGROUND OF INVENTION

Very large scale integrated circuit devices typically are manufactured on a substrate, such as a silicon wafer, by a sequence of material additions, such as low pressure chemical vapor depositions, sputtering operations, among others; material removals, such as wet etches, reactive ion etches, among others; and material modifications, such as oxidations, ion implants, among others. Typically, these physical and chemical operations interact with the entire substrate. For example, if a substrate is placed into an acid bath, the entire surface of the substrate will be etched away. In order to build very small electrically active devices on a substrate, the impact of these operations has to be confined to small, well-defined, regions.

Lithography in the context of VLSI manufacturing includes the process of patterning openings in photosensitive polymers, sometimes referred to as "photoresists" or "resists", which define small areas in which substrate material is modified by a specific operation in a sequence of processing steps.

The radiation preferably causes desired photochemical reactions to occur within the photoresist. Preferably, the photochemical reactions alter the solubility characteristics of the photoresist, thereby allowing removal of certain portions of the photoresist. Photoresists can be negative photoresist or positive photoresist materials.

A negative photoresist material is one which is capable of polymerizing and being rendered insoluble upon exposure to radiation. Accordingly, when employing a negative photoresist material, the photoresist is selectively exposed to radiation, causing polymerization to occur above those regions of the substrate which are intended to be protected during a subsequent operation. The unexposed portions of the photoresist are removed by a solvent which is inert to the polymerized portion of the photoresist. Such a solvent may be an aqueous solvent solution.

Positive photoresist material is a material that, upon exposure to radiation, is capable of being rendered soluble in a solvent in which the unexposed resist is not soluble. Accordingly, when applying a positive photoresist material the photoresist is selectively exposed to radiation, causing the reaction to occur above those portions of the substrate which are not intended to be protected during the subsequent processing period. The exposed portions of the photoresist are removed by a solvent which is not capable of dissolving the exposed portion of the resist. Such a solvent may be an aqueous solvent solution.

Selectively removing certain parts of the photoresist allows for the protection of certain areas of the substrate while exposing other areas. The remaining portions of the photoresist may be used as a mask or stencil for processing the underlying substrate. For example, the openings in the mask may allow diffusion of desired impurities through the openings into the semiconductor substrate. Other processes are known for forming devices on a substrate.

The manufacturing of VLSI chips typically involves the repeated patterning of photoresists, followed by etch, implant, deposition, or other operation, and ending with the removal of the exposed photore!sist to make way for the new photoresist to be applied for another iteration of this process sequence.

Devices such as those described above, may be formed by introduction of a suitable impurity into a wafer of a semiconductor to form suitably doped regions therein. In order to provide distinct P or N regions, which are necessary for the proper operation of the device, introduction of impurities should occur through only a limited portion of the substrate. Usually, this is accomplished by masking the substrate with a diffusion resistant material, which is formed into a protective mask to prevent diffusion through selected areas of the substrate.

Basic lithography systems typically include a source of light, typically not visible light, a stencil or photomask including a pattern to be transferred to a substrate, a collection of lenses, and a means for aligning existing patterns on the substrate with patterns on the mask or stencil.

Conventional photomasks typically consist of chromium patterns on a quartz plate, allowing light to pass wherever the chromium has been removed from the mask. Light of a specific wavelength is projected through the mask onto the photoresist coated substrate, exposing the photoresist wherever chromium has been removed from the mask permitting light to pass through the mask. Exposing the resist to light of the appropriate wavelength causes modifications in the molecular structure of the resist polymers, which permits the use of developer to dissolve and remove the resist in the exposed areas. Resists that act as just described are known as "positive" resists. On the other hand, negative resist systems permit only unexposed areas to be removed by the developer.

Photomasks, when illuminated, can be pictured as an array of individual, infinitely small light sources that can be either turned on, such as areas not covered by chromium or other material, or turned off, such as areas covered by chrome or other material. If the amplitude of the electric field vector that describes the light radiated by these individual light sources is mapped across a cross-section of the mask, a step function will be plotted reflecting the two possible states that each point of the mask can be found, either light on or light off.

Conventional photomasks are commonly referred to as "chrome on glass" (COG) binary masks, due to the binary nature of the image amplitude. The perfectly square step function of binary masks actually exists only in scalar theory and typically only in the level of the exact mask plane. Any distance away from the mask, such as at the substrate plane, diffraction will cause images to exhibit a finite image slope. At small dimensions, that is, when the size and spacing of the images to be printed are small relative to the wavelength and inverse of the numerical aperture, the electric field vectors of adjacent images will interact and add constructively.

Therefore, not only is diffraction a phenomenon that must be addressed when dealing with very small images, interference must also be addressed. The resulting light intensity curve between features is not completely dark, as a result of the diffraction and interference phenomenon. Rather, the light intensity curve exhibits significant amounts of light intensity created by the interaction of adjacent features.

The resolution of an exposure system is limited by the contrast of the projected image, that is, the intensity difference between adjacent light and dark features. An increase in the light intensity in nominally dark regions will eventually cause adjacent features to print as one combined structure rather than as discrete images.

In an effort to increase the capability of electronic devices, the number of circuit features included on, for example, a semiconductor chip, has greatly increased. When using a process such as that described above for forming devices on, for instance, a semiconductor substrate, increasing the capability and, therefore, the number of devices on a substrate requires reducing the size of the devices or circuit features. One way in which the size of the circuit features created on the substrate has been reduced is to employ mask structures having smaller openings.

Such smaller openings treat smaller portions of the substrate, thereby creating smaller structures in the photoresist. In order to produce smaller structures in the photoresist, shorter wavelength ultraviolet radiation is also used in conjunction with the mask to image the photoresist. Such shorter wavelengths of radiation have also been particularly effective at curing or hardening photoresist materials used in fabricating the devices.

The increasingly small and densely packed devices being formed on semiconductor substrates increases the effects of diffraction, for example. As discussed above, radiation passing through a mask in semiconductor device manufacture processes behaves as it does in any other context. Accordingly, as a result of diffraction of the radiation, the radiation may expose areas of the substrate not directly in line with the transparent area of the mask that the radiation is passing through. Diffraction of radiation may result in a feature of an intended size being formed of different sizes, as a result of whether the feature is formed in a group of other features or in isolation.

SUMMARY OF INVENTION

Aspects of the present invention provide a microlithography mask for producing equal size features in a substrate. A first region of the mask is for exposing a first portion of the substrate corresponding to a first feature that is to be performed on a substrate. The mask also includes at least one compensating region in the vicinity of the first region for partial exposing the first feature and it also exposing a second portion of the substrate corresponding to a second feature, wherein the second feature is to be removed from the substrate.

Aspects of the present invention also provide a method of forming an isolated image segment having physical characteristics of an optical proximity affected segment in a semiconductor mask. A portion of a first photoresist layer on the substrate corresponding to a first feature that is to be formed in the first photoresist layer is exposed. At least one compensating portion of the first photoresist layer adjacent the first region is exposed such that exposing the compensating portion at least partially exposes the first feature. The at least one compensating feature is subsequently removed.

Still other aspects, objects, and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIGS. 3a and 3b illustrate a method to quantify diffraction affects of optical CD metrology tool; and FIGS. 4a and 4b illustrate a method to measure the true nested to isolated CD delta.

DETAILED DESCRIPTION OF THE INVENTION

As mentioned above, as result of diffraction of the radiation, a feature to be formed in, for example, photoresist, may have different characteristics when formed isolated from other features on a substrate as compared to when the same feature is formed closely grouped with other features. The present invention provides a method and masks to produce equal size features, regardless of where the features are formed in isolation or in close proximity to other features.

As stated above, radiation used to expose photoresist on a substrate during semiconductor device manufacturer is subject to the same physical laws as radiation in any other environment. Therefore, as the radiation passes through transparent areas of microlithography masks, the radiation is subject to diffraction effects. Therefore, the isolated feature typically will not have the same size as the feature formed in close proximity to other features.

Figure 1A:
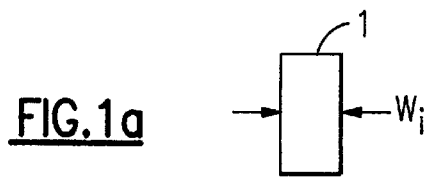
FIG. 1a and FIG. 1b represent a feature formed in isolation on a substrate and its width and a feature formed in a group of features and its width, respectively.
Figure 1B:
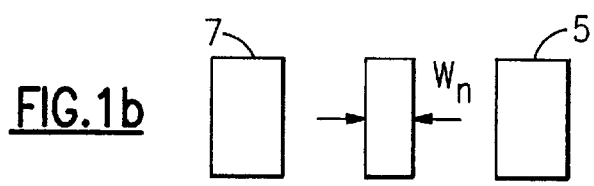

FIG. 1a and FIG. 1b illustrate, respectively, a feature formed in isolation and a feature formed in a group of features. The feature 1 illustrated in FIG. 1a and the feature 3 illustrated in FIG. 1b are formed from the same size opaque lines in the microlithography mask. Feature 1 has a width $w_i$, while feature 3 has a width $w_n$. Feature 3 is formed with features 5 and 7 in close proximity thereto.

As features 3, 5 and 7 are exposed, due to diffraction effects, feature 3 will be affected by adjacent features 5 and 7. As a result, when features are formed in a group as illustrated in FIG. 1b, the features typically will have a slightly smaller size than the opaque portion of the mask designed to create the feature on the substrate. This is illustrated in FIG. 1a and FIG. 1b by the difference in width between the features 1 and the feature 3.

In addition to optical diffraction or optical proximity effects, etch loading effects also cause nested features to be different than isolated features. For example, IC fabrication resist features are typically transferred into substrates such as silicon by using etch processes such as reactive ion etching. Due to different etch loading, isolated features and nested features are etched differently especially when the features have a large aspect ratio (the ratio between etch depth and feature width). The present invention addresses the nested-to-isolated linewidth delta caused by both optical proximity and chemical processes, such as etch and resist develop.

The problem is that if it is desired that features 1 and 3 have the same width, if the features are produced according to known methods utilizing known microlithography masks, $w_i$ will not equal $w_n$. This disparity in feature sizes is particularly important in relation to device speed sorts.

Although the above discussion relates particularly to issues related to wafer printing, another important component in microlithography is mask printing. Masks are subject to similar nested-to-isolated linewidth variation as in wafer printing. A mask is typically printed either by laser beam or electron beam lithography. The exposed resist is then developed and finally the resist pattern is transferred into final mask material by etching. Proximity effects of laser beam or electron beam printing and etch loading effect all cause nested-to-isolated linewidth delta on the mask. The present invention is useful to these and other issues related to the mask level. Additionally, the current invention addresses mask critical dimension (CD) metrology issues. The present invention also includes methods and masks to characterize CD metrology tools used in mask fabrication.

The present invention provides a natural way of making all features the same way rather than utilizing a separate method and apparatus for creating isolated features. According to the present invention, a microlithography mask is utilized that includes a first region for exposing a first portion of a substrate corresponding to a first feature that is to be formed on the substrate. The mask also includes at least one compensating region in the vicinity of the first region for partially exposing the first portion of the substrate and the second portion of the substrate corresponding to a second feature. The portion of the substrate corresponding to the second feature is to be removed. The at least one compensating region of the mask provides the mask with the capacity to affect the first portion of the substrate. When the second feature or features are removed from the substrate, what is left is an isolated feature that has dimensions similar to if the feature were formed in a group of features.

Figure 2A:
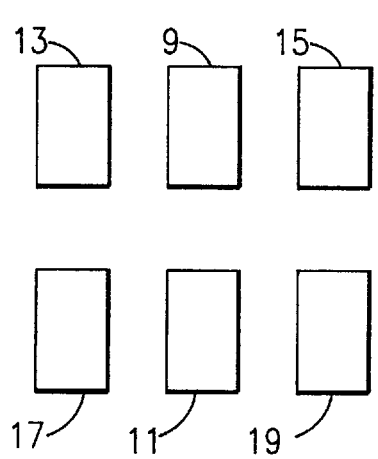
FIGS. 2a–c represent various stages of a process according to the present invention for forming a feature of substantially the same size in isolation or in a group of features.
Figure 2B:
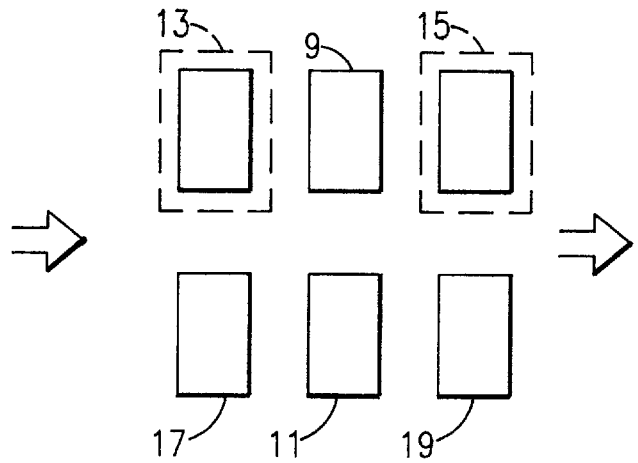
Figure 2C:
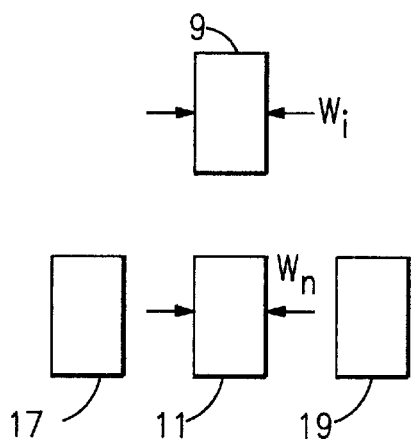

FIGS. 2a–c illustrate a stages in an embodiment of a process according to the present invention for forming an isolated feature 9 and a similarly sized feature 11, where the feature 11 is arranged in a group of features. As shown in FIG. 2a, feature 9 is formed in the substrate with adjacent features 13 and 15 arranged on either side of it. Features 13 and 15 are referred to herein as "compensating features". The features are formed by corresponding compensating regions in a microlithography mask.

Feature 11 is also formed with features 17 and 19 arranged on either side of it. Unlike features 17 and 19, as illustrated in FIG. 2a, features 13 and 15 are then removed, leaving feature 9 in isolation as illustrated in FIG. 2c. As a result, the substrate includes feature 9 in isolation with a width $w_i$ and feature 11 grouped between features 17 and 19 with a width $w_n$. However, unlike the result illustrated in FIGS. 1a and b, in FIG. 2c, $w_i=w_n$.

After forming the features are shown in FIG. 2a, all the features may be developed and etched. A layer of photoresist may then be applied over all of the features. In the second layer of photoresist, only features 13 and 15 may be exposed. Then, the second layer of photoresist may be developed and features 13 and 15 etched away, thereby leaving only the original design feature 9.

The present invention is not limited to including compensating features on two sides of a feature and ultimately is to be isolated as feature 9 is surrounded by features 13 and 15. For example, only one feature 13 or 15 could be formed adjacent feature 9. Additionally, or alternatively, features could be formed adjacent the top and bottom of feature 9, when considering the orientation of the views shown in the figures. This means the compensating features are in the same plane, just adjacent a different side of feature 9 as compared to compensating features 13 and 15. Actually, any number of features with any shape could be formed at any location around the feature such as feature 9 that is ultimately to be an isolated feature on the substrate.

In view of the above, a microlithography mask according to the present invention may include at least one compensating region adjacent at a feature to be isolated on a substrate. Therefore, a mask according to the present invention could include two compensating regions adjacent each of two sides of a first region. Such a mask would be utilized in a process illustrated in FIGS. 2a–2c.

The shape of the regions in the mask could be whatever shape is desired or necessary to achieve the desired exposure by diffraction of the feature that is to be isolated on the substrate. A mask that would be utilized in a process to form features shown in FIGS. 2a–2c would have rectangular-shaped regions. The compensating regions may extend along the side of the isolated feature forming region only as far as regions would extend a mask wherein grouped features are to be formed. In any case, preferably, the compensating regions in the mask result in sufficient energy being diffracted to the isolated feature portion of the substrate to result in an isolated feature being formed that has the same dimensions as the feature would have if it were formed in a group of features.

The second invention may also include a second mask that includes only at least one compensating region in substantially the same location as the compensation regions are located in the first mask.

As stated above, the present invention also includes a method and a mask for mask CD metrology. Mask CD metrology tools have their own proximity effects. For example, optical microscope-based CD metrology tools are subject to optical diffraction effects. Additionally, scanning electron microscope-based CD metrology tools are subject to electron scattering. These proximity effects can cause features with identical physical size to be measured differently, depending upon whether the features are in an isolated environment or in a nested environment with other features in the vicinity.

A group of features such as those illustrated in FIGS. 3a–3b may be utilized to quantify the proximity effects of CD metrology tools. FIG. 3a illustrates two features 21 and 23 fabricated in the same nested environment. Therefore, features 21 and 23 have substantially similar physical sizes. Features 25 and 27 are subsequently removed, resulting in features as illustrated in FIG. 3b.

Features 21 and 23 are then measured with a CD metrology tool. Because of proximity effects of the CD metrology tool, features 21 and 23 will not be measured the same even though they may have substantially the same physical size. Thus, the difference between the measurements of $w_i$ and $w_n$ is a quantitative measurement of the proximity effects of the CD metrology tool. This difference can be subsequently used to correct the CD metrology tool.

The group of features illustrated in FIGS. 4a and 4b can be utilized to measure the true CD difference between nested features and isolated features without knowing the exact proximity effect of CD metrology tools. As shown in FIG. 4a, feature 33 is printed without adjacent features, while feature 35 is printed in a nested environment. Therefore, features 33 and 35 have different physical sizes. Features 37 and 39 are subsequently removed, resulting in features shown in FIG. 4b.

Features 33 and 35 are subsequently measured on a CD metrology tool. Because both features 33 and 35 exist in an isolated environment, the proximity effect of the CD metrology is similar. Consequently, the measurement difference between $w_i$ and $w_n$ is the true nested-to-isolated CD difference.

The above-described techniques may also be utilized at the wafer level to characterize wafer CD metrology tools as well as to measure true nested-to-isolated differences of wafer processes.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. The method for determining optical proximity effects of critical dimension metrology tools, comprising the steps of:

exposing a first portion of a first photoresist layer on a substrate corresponding to a first feature that is to be formed in said first photoresist layer;

exposing at least one compensating portion of said first photoresist layer adjacent said first portion to form at least one compensating feature such that exposing said compensating feature at least partially exposes said first feature;

exposing a nested portion of said first photoresist layer corresponding to a nested feature that is to be formed in said first photoresist layer corresponding to said first portion;

exposing a number of surrounding portions of said first photoresist layer adjacent said nested portion to form surrounding features such that the number and arrangement of said surrounding features corresponds to the number and arrangement of said at least one compensating feature with respect to said first portion, resulting in said first feature and said nested feature having substantially similar dimensions;

removing said at least one compensating feature;

measuring the dimensions of said first feature and said nested feature with said metrology tool;

determining a difference between said measured dimensions of said first feature and said nested feature to determine the optical proximity effects of said metrology tool.

2. The method according to claim 1, further comprising the step of:

correcting said metrology tool by correcting for said optical proximity effects determined by determining the difference in said measured dimensions of said first feature and said nested feature.

* * * * *